United States Patent
Mohamed Zuhair et al.

(10) Patent No.: US 9,772,174 B2
(45) Date of Patent: Sep. 26, 2017

(54) CAPACITOR BASED ANGLE SENSOR

(71) Applicant: Schlumberger Technology Corporation, Sugar Land, TX (US)

(72) Inventors: Mohamed Naushad Mohamed Zuhair, Yokohama (JP); Jiro Takeda, Machida (JP)

(73) Assignee: SCHLUMBERGER TECHNOLOGY CORPORATION, Sugar land, TX (US)

( * ) Notice: Subject to any disclaimer, the term of this patent is extended or adjusted under 35 U.S.C. 154(b) by 192 days.

(21) Appl. No.: 13/925,844

(22) Filed: Jun. 25, 2013

(65) Prior Publication Data
US 2014/0375340 A1    Dec. 25, 2014

(51) Int. Cl.
*G01B 7/30*  (2006.01)
*G01R 27/26*  (2006.01)

(52) U.S. Cl.
CPC .......... *G01B 7/30* (2013.01); *G01R 27/2605* (2013.01)

(58) Field of Classification Search
CPC .............................. G01B 7/30; G01R 27/2605
USPC ......................................... 324/684
See application file for complete search history.

(56) References Cited

U.S. PATENT DOCUMENTS

| | | | |
|---|---|---|---|
| 4,864,295 A | | 9/1989 | Rohr |
| 4,972,725 A | * | 11/1990 | Choisnet .................. 73/862.337 |
| 6,118,283 A | | 9/2000 | Cripe |
| 6,147,855 A | * | 11/2000 | Taylor, Jr. ...................... 361/277 |
| 6,449,853 B1 | * | 9/2002 | Brueggemann ............... 33/1 PT |
| 6,774,642 B2 | | 8/2004 | Lin et al. |
| 2013/0015862 A1 | | 1/2013 | Ludwig |

FOREIGN PATENT DOCUMENTS

| | | | | |
|---|---|---|---|---|
| JP | 59-000602 | * | 1/1984 | ............... G01B 7/30 |
| JP | 2012-058106 | | 3/2012 | |

OTHER PUBLICATIONS

International search and written opinion for the equivalent PCT patent application No. PCT/US2014/044093 issued on Oct. 28, 2014.

\* cited by examiner

*Primary Examiner* — Jeff Natalini
(74) *Attorney, Agent, or Firm* — Trevor G. Grove

(57) ABSTRACT

A capacitor based sensor for angular position detection having two fixed plates arranged at an angle and a semicircular rotating plate in between. The sensor can determine any angular position in the full 0-360 degrees range. The sensor may be temperature compensated, and integrated with electronics such that sensor module only has two electrical leads, one for input power and one for input/output digital data. A method for converting capacitance measurements to an angle is also disclosed.

15 Claims, 17 Drawing Sheets

CAPACITOR BASED ANGLE SENSOR

CROSS-REFERENCE TO RELATED APPLICATIONS

None.

BACKGROUND

This disclosure relates to a capacitor based sensor to detect angles or angular positions.

An angle or an angular position is one of the basic physical parameters needed in many scientific or engineering fields. An angle or an angular position may be determined or measured by many different instruments or methods. Some methods are direct measurements, such as using a compass to measure an angle. Other methods are less direct, such as using a string tied around a wheel. The amount of angle rotated by the wheel can be determined from the linear length of the released or retrieved string and the known radius of the wheel.

Some electrical or electromagnetic methods or sensors may use electrical or electromagnetic properties to determine an angular position or change. These sensors may be more easily integrated with other electronics or microprocessors to make the angle measurements and their applications automatic with less human intervention.

A capacitor based sensor or method is a popular type of sensor or method and is used in many applications. For example, U.S. Pat. No. 6,118,283 and U.S. Pat. No. 6,774,642, other references cited within these patents disclose many prior art sensors used for angular position measurement. The basic idea is that the sensor has several fixed metal plates and several rotating metal plates and that there are dielectric materials separating the fixed plates from the rotating plates. When the rotating plates are rotated to different angular positions, the capacitances between the fixed plates and the rotating plates will change; the angular positions and the capacitances are related. Thus, from knowing the capacitance, the angular position may be determined. In addition, the capacitance may be measured by many known methods.

Due to their design and their intended working environments, various types of capacitor based sensors may have many limitations. Many sensors may not work in extreme temperature or high pressure environments; many may not have desirable accuracy or consistency; many are complicated or have complicated electromagnetic requirements; and many are expensive.

It is desirable to have a sensor or a method that can make angle measurement cheaper, more accurate and simpler, or other desirable properties.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

This disclosure relates to a capacitor based angular position sensor that has two fixed plates arranged in an offset position and a rotating plate in between. The two fixed plates and the rotating plate form two capacitors. The combination of the two capacitances of the two capacitors has a one-to-one linear relationship with the angular position of the rotating plate. The measurements of the two capacitances can uniquely determine the angular position of the rotating plate over a full circular range of 0-360 degrees. The capacitors may be integrated with an acquisition circuit to digitize the measured capacitances and may be further integrated with a microprocessor which can convert the digitized capacitances to angle measurements.

The sensor may be packaged in an integrated form that only requires one power input, one digital input/output representing the angle. There are minimum, rigid connections between the capacitors and their acquisition circuits which have minimum stray capacitance.

The sensor may include an optional third fixed plate. The second and the third fixed plate may form a third capacitor which should have a fixed capacitance. This third capacitor is used as a reference capacitor for environment effect compensation.

This disclosure also discloses a method that converts the two measured capacitances to an angle θ that is within the full circular range of 0-360 degrees.

BRIEF DESCRIPTION OF DRAWINGS

Embodiments of this disclosure are described with reference to the following figures. The same numbers are used throughout the figures to reference like features and components. A better understanding of the methods or apparatuses can be obtained when the following detailed description of the several embodiments is considered in conjunction with the following drawings, in which:

FIG. 2a illustrates a perspective view of a sensor according to one embodiment and FIG. 2b illustrates a diagram of theoretical angle versus capacitance curves of the capacitors in the sensor as shown in FIG. 2a.

DETAILED DESCRIPTION

Figure 1A:
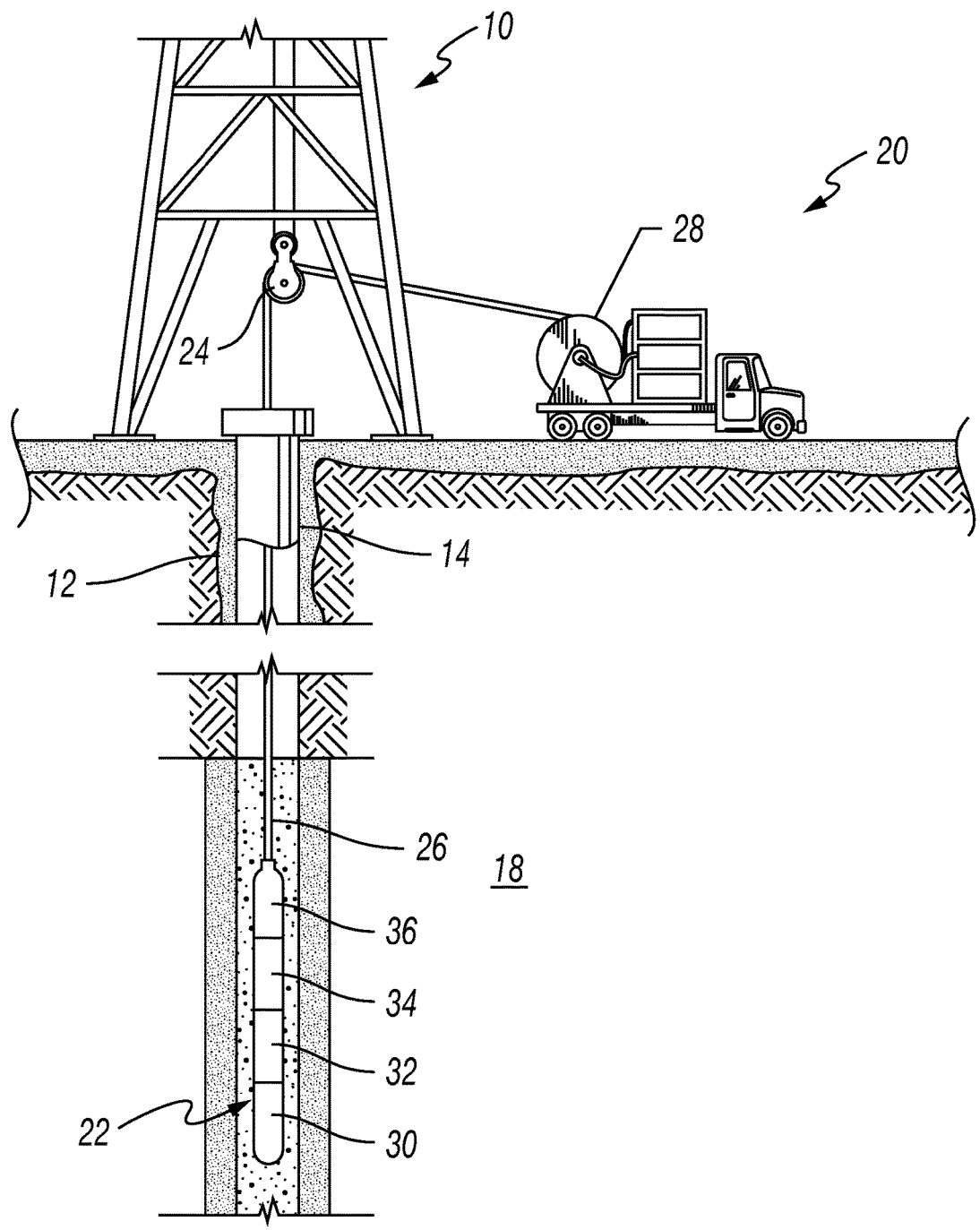
FIG. 1a illustrates a perspective view of an oil field operation with wireline logging.

Reference will now be made in detail to embodiments, examples of which are illustrated in the accompanying drawings and figures. In the following detailed description, numerous specific details are set forth in order to provide a thorough understanding of the subject matter herein. However, it will be apparent to one of ordinary skill in the art that the subject matter may be practiced without these specific details. In other instances, well-known methods, procedures, components, and systems have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step. The first object or step, and the second object or step, are both objects or steps, respectively, but they are not to be considered the same object or step.

The terminology used in the description of the disclosure herein is for the purpose of describing particular embodiments only and is not intended to be limiting of the subject matter. As used in this description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event.]" or "in response to detecting [the stated condition or event]," depending on the context.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" includes, but is not limited to, portable or fixed storage devices, optical storage devices, wireless channels and various other mediums capable of storing, containing or carrying instruction(s) and/or data.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium such as storage medium. A processor(s) may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Figure 1B:
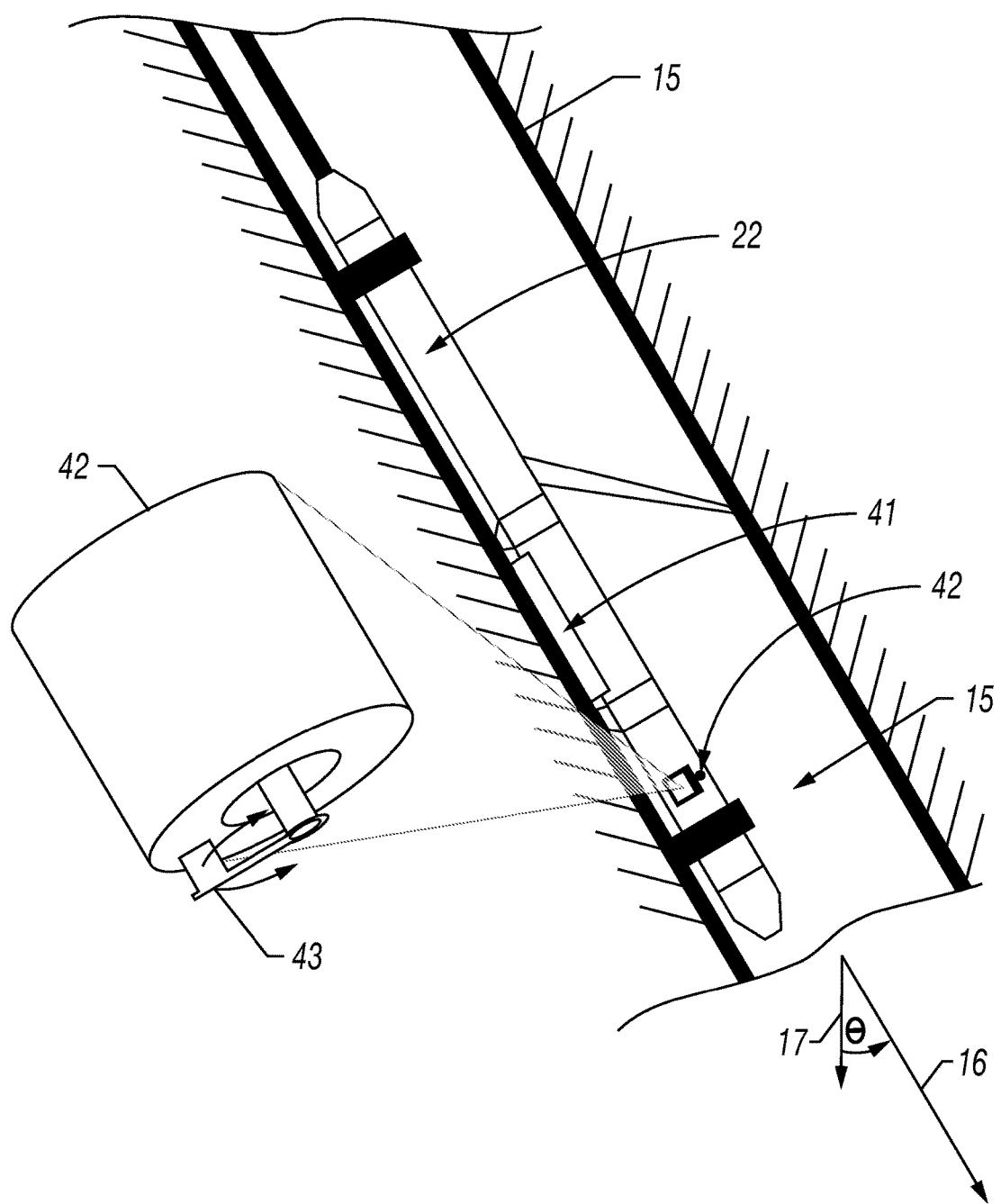
FIG. 1b illustrates a section of inclined borehole with a logging tool.
Figure 1C:
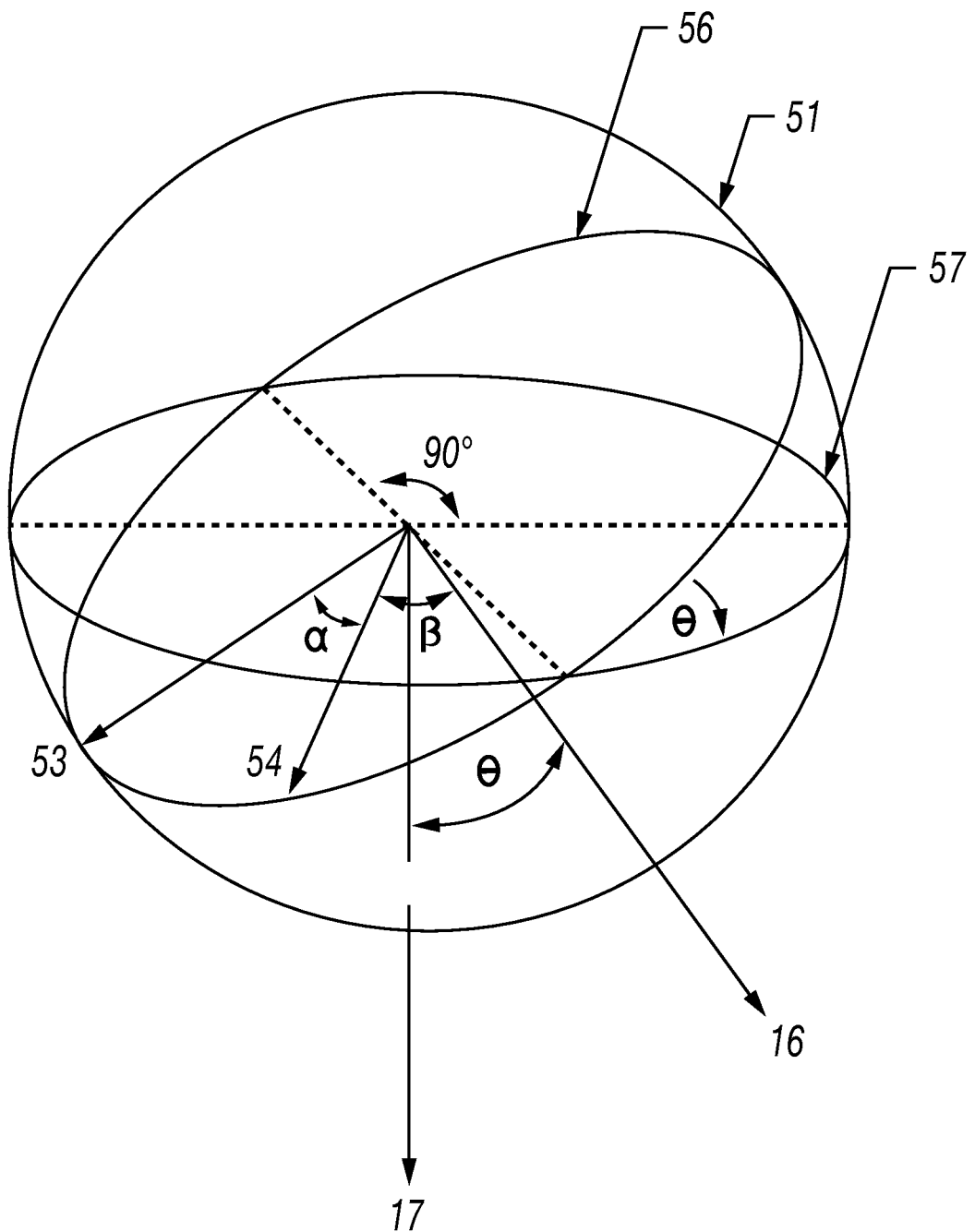
FIG. 1c illustrates a coordination system.

FIGS. 1a, 1b and 1c illustrate one example of an oil field operation where logging tools containing angle sensors are used. In this a conventional oil well drilling derrick 10 is shown positioned above an oil well borehole 12 that has been drilled into the earth. A casing 14 has been installed at the top of the bore hole and is cemented in place. The borehole may extend thousands of feet into the earth's crust such as 25,000 feet into an oil bearing formation 18. Operational pressures at this depth may be 20,000 pounds per square inch with temperatures in the range of 150 to 175° C. In addition, the borehole is filled with drilling fluid or mud which has a corrosive particulate characteristic.

Notwithstanding such a harsh operating environment, scientists need to make scientific and technical borehole measurements and record significant quantities of formation and borehole data to insure a successful drilling operation and subsequent production of oil and/or gas from a subterranean formation.

In order to accomplish this data collection a well logging service vehicle 20 is driven to the site and delivers a logging tool 22 which is lowered via the derrick 10 and a traveling block 24 into the borehole suspended from a wireline 26. The wireline is paid out from a reel typically mounted on the service vehicle 20. The surface vehicle also usually carries data memory and computer processing to examine certain downhole well data on a real time basis.

The logging tool 22 is often composed of several tools 30, 32 and 34 which are selected by scientists to perform a variety of functions as discussed above. At the top of the logging tool 22 is a cartridge 36 which carries electronic components on PCBs and a power supply for the various tool functions including telemetry communication.

In operation the logging tool 22 is lowered down to a production formation 18 and then withdrawn taking incremental measurements as the tool is raised toward the surface. Critical real time data can be delivered via the wireline or a fiber optic cable to the service vehicle 20 for immediate processing.

In FIG. 1a, only straight vertical sections of a borehole is shown, but in many modern wells, many sections of boreholes are inclined, even horizontal. One inclined section 15 is shown in FIG. 1b, together with a wireline tool 22 inside the section 15. The borehole direction 16 is deviated from direction of gravity 17 by an angle θ. To interpret the logging data properly, the position and orientation of the tool 22 are usually needed, so sensor 41 and angle sensor 42 are often part of various sensors included in the tool 22. An enlarged angle sensor 42 is also illustrated to shown its orientation. The angle sensor may have an "arm" 43, which may rotate freely. It will always seek to be at the lowest position.

To facilitate the discussion, FIG. 1c illustrates a coordination system related to FIG. 1b. The borehole direction 16 and the gravity direction (vertically down) 17 form an angle θ. The horizontal plane 57 is perpendicular to the vertical direction 17; the plane 56 is perpendicular to the borehole direction 16; the vertical direction 17 is in the vertical plane 51. Within the plane 56, direction 53 points to the lowest position which is the position of the sensor arm 43 of the angle sensor 42. An angle α is the measurement angle by the angle sensor. It gives the tool sensor direction relative to the angle sensor. The angle β is the angle of the tool sensor relative to the intersection of a horizontal plane and a plane normal to the borehole direction. This is the angle to be determined for tool orientation. As shown in FIG. 1c, the sum of angle α and β is always 90 degrees. This is because the angle sensor arm 43 rotates to the intersection line of a vertical plane 51 and the plane normal to the borehole due to its mass. Therefore the angle β can be determined by subtracting 90 degrees from the measured angle α. The angle θ is already known for a given borehole, which is obtained by measurement while the borehole is drilled. With known angle θ and determined angle β, the orientation of the logging tool 22 is known.

This example illustrates the use of an angle sensor in the downhole environment in an oil field. Because of the harsh operating condition as mentioned above, the angle sensor 42 has to be manufactured in such a way to endure such conditions. Most capacitor based angle sensors cannot endure such conditions and cannot be used. In many logging tools, the angle sensors are resistors-based. The linearity or sensitivity of these resistor-based sensors may not be optimum.

Figure 2A:
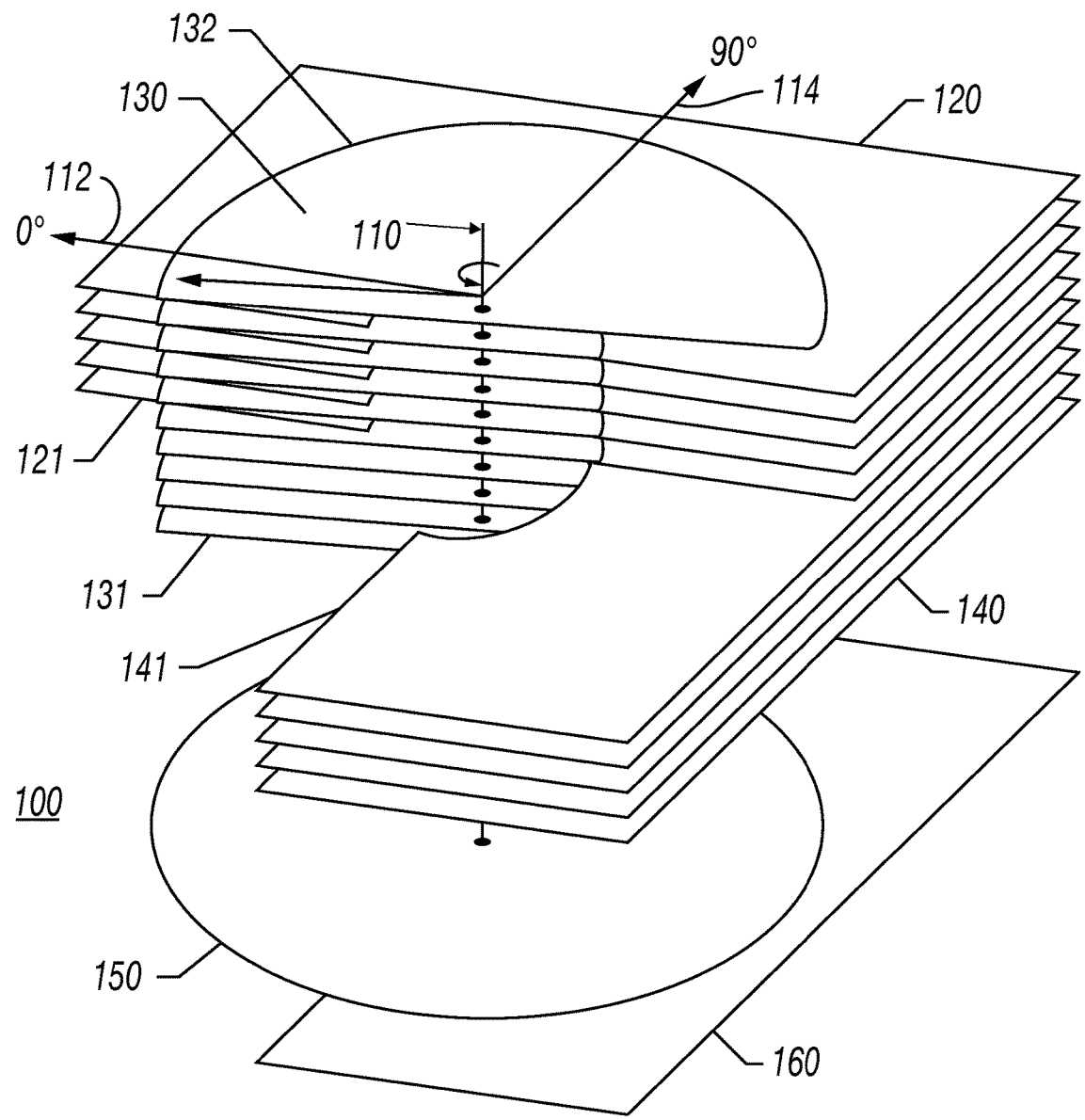
Figure 2B:
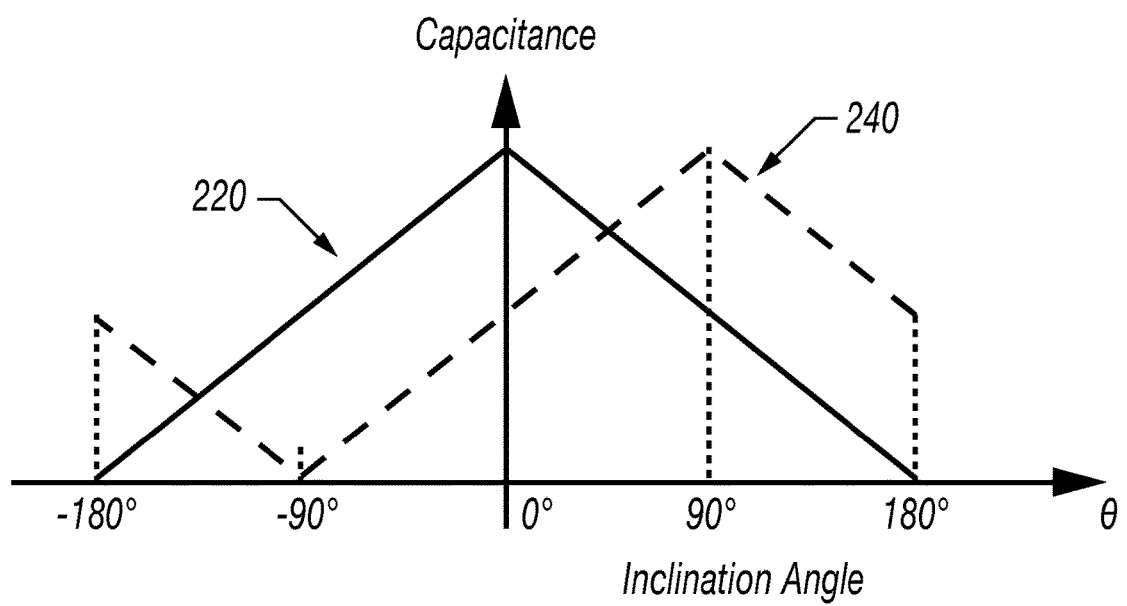

FIG. 2a illustrates a sketch of a sensor 100 according to one embodiment and FIG. 2b illustrates the theoretical capacitance versus angle curves for the two capacitors in FIG. 2a. The sensor has a rotating axle 110 around which rotating plate 130 can rotate to any angular position in the full range of 0-360 degrees. For ease of discussion, 0° axis 112 and 90° axis 114 are illustrated. The 0° axis (Y-axis) 112, 90° axis (X-axis) 114, and the rotating axle (Z-axis) 110 form an x-y-z coordinate system. In this disclosure, a plate refers to an object whose size in x- or y-dimension is at least one order of magnitude greater than its size in z-dimension. The rotating plate 130 is a semicircular plate which can rotate freely in the x-y plane. It has a straight side 131 and a circular side 132. Each of the two fixed plates 120 and 140 has a straight side, straight side 121 and straight side 141. The straight side 121 of fixed plate 120 is situated along the Y-axis (in 0° axis) which represents the angular position of plate 120, which may be referred as 0-plate. The straight side 141 of fixed plate 140 is situated along the X-axis (in 90° axis) which represents the angular position of plate 140, which may be referred as 90-plate. The 0-plate and 90-plate may be of rectangular shape or any other elongated shape with at least one straight edge (e.g. 121 or 141). In FIG. 2a, five sets are shown for fixed plates 120 and 140, and rotating plate 130, but only one set is needed, and the number of pieces is a design parameter which can be selected based other considerations. Fixed 0-plate 120 and rotating plate 130 form a 0-capacitor 220; fixed 90-plate 140 and rotating plate 130 form a 90-capacitor 240. These plates, fixed or rotating, are electrically conducting plates. They may be made of metal or any non-conductive substrates with conductive coating.

As shown in FIG. 2b, the two capacitors 220 and 240 have two different capacitance v inclination angle curves. The measured capacitance of capacitor 220 and 240 can uniquely determine the angular position of the rotation plate 130, which is the same as the angular position of the rotating axle 110. An angular offset between the two fixed plates refers to the angle between the straight edges 121 and 141. The angular offset between the fixed plates 120 and 140 is 90° as shown in FIG. 1. 90° is an optimum value for the measurement which may reduce the error of the capacitor to angle algorithm to a minimum. 90° is also selected for the convenience of discussion and manufacturing. It can be any number between 0° and 180° excluding 0° and 180° if it is convenient for other purposes.

The fixed plates may be rectangular as shown in FIG. 1. They may also be semicircular as shown in other figures discussed below, or any other shapes for various considerations, as long as each covers the entire semicircular rotating plate when the straight edge of the rotating plate aligns with the straight edge of the fixed plate.

The dielectric material between the plates 120, 130 and 140 may be any suitable materials depending on the operating condition or environment of the sensor. For example, the dielectric material may be nothing, i.e. the internal space within the sensor is maintained in a vacuum. The dielectric constant of vacuum does not change with temperature, so the sensitivity of capacitors remains constant with respect to temperature. Such a sensor is useful for operating in environments where the temperature changes.

The material may be an inert gas, such as Helium, Argon etc., while their dielectric constants may not be as stable as that of vacuum, inert gas may help maintain the mechanical integrity of the sensor if the sensor is operated under high pressure. A high pressure operating condition is often encountered in many industries, such as oil and gas production fields or industrial manufacturing plants.

In one embodiment, where the range of operating temperature is large and the effect of temperature on the dielectric constant becomes a concern, an optional fixed plate 160 may be added to the sensor as shown in FIG. 2a. The fixed plates 140 and 160 may form a third capacitor 260 (not shown) that should have fixed capacitance. Any changes in the measured capacitance will be due to the temperature (or other operating conditions). The other two capacitors 220 and 240 are operating in the same environment, so they should have the same effects from the temperature as capacitor 260. Thus, using the measured capacitance 260, the temperature compensated (or normalized) capacitances of 240 and 220 may be determined. Then, the temperature compensated (or temperature independent) angle can be determined from FIG. 2b.

Another circular plate 150 may be used to have plates 150 and 160 form an independent capacitor 250 (not shown). This may be more convenient to manufacture. The independent capacitor 250 may be easier for measurement.

Figure 3:
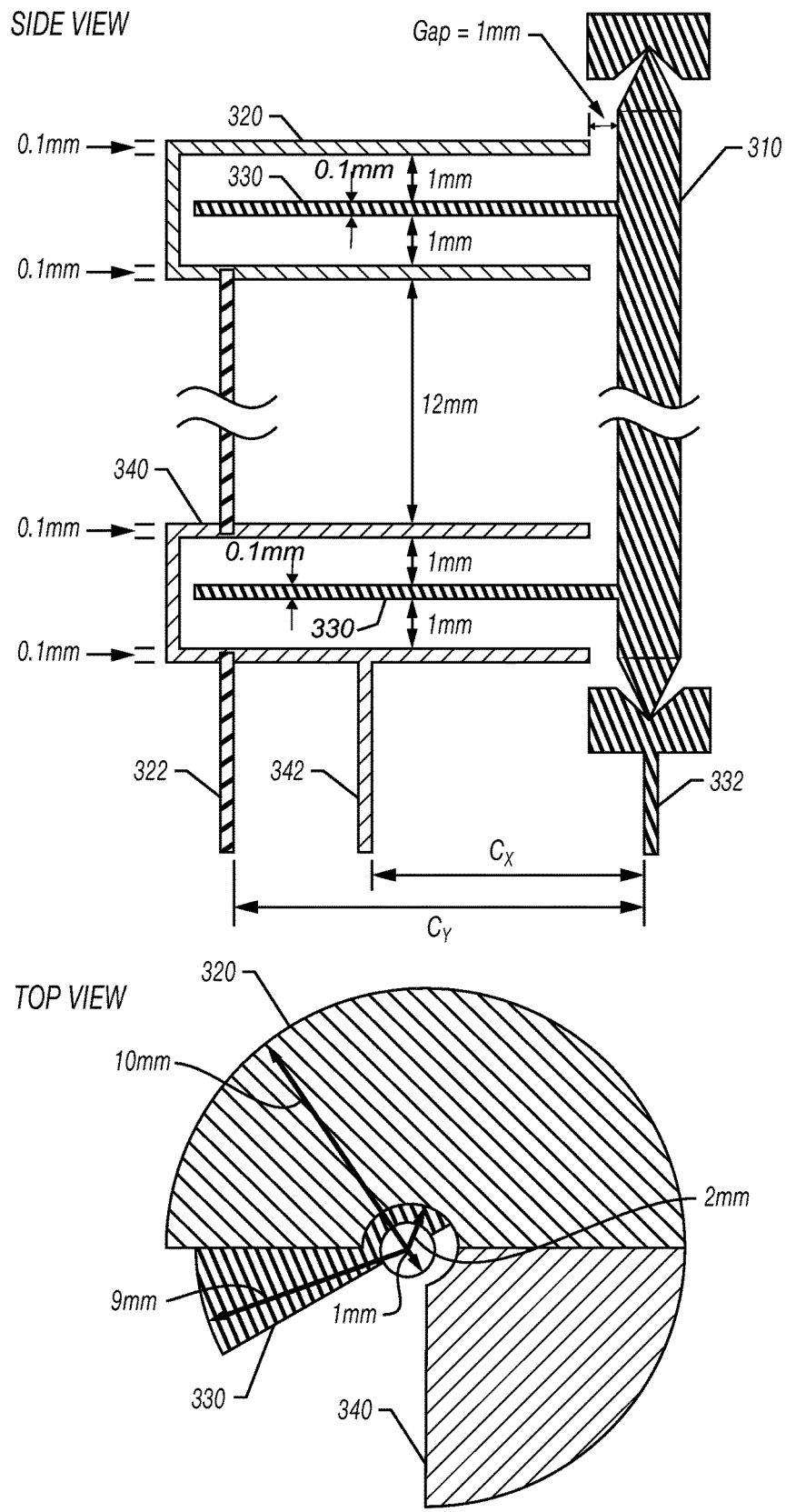
FIG. 3 illustrates a few views of the internal structures of a sensor according to one embodiment.
Figure 4A:
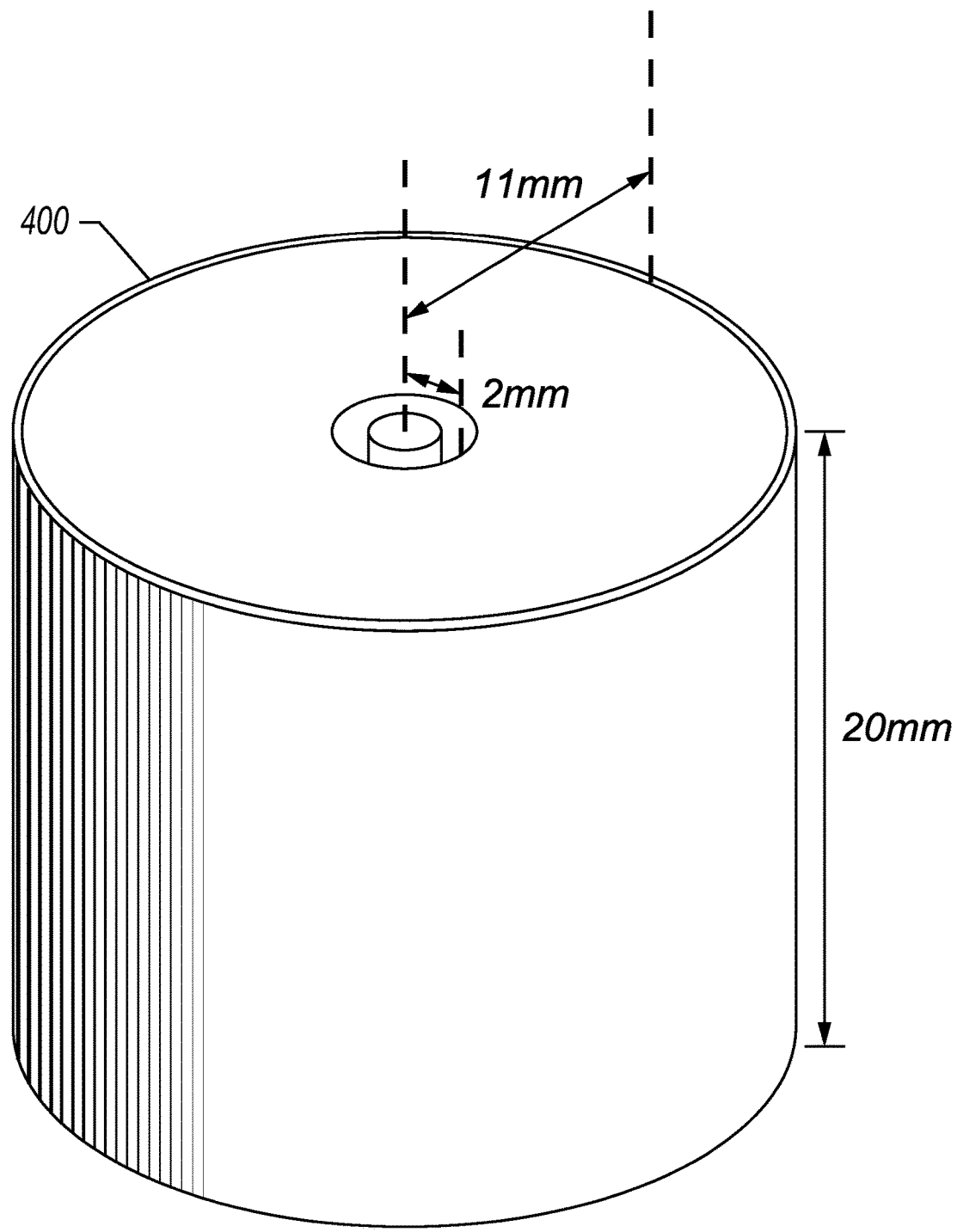
FIG. 4a-4d illustrates a few more views of the sensor as in FIG. 3 with sample dimensions.
Figure 4B:
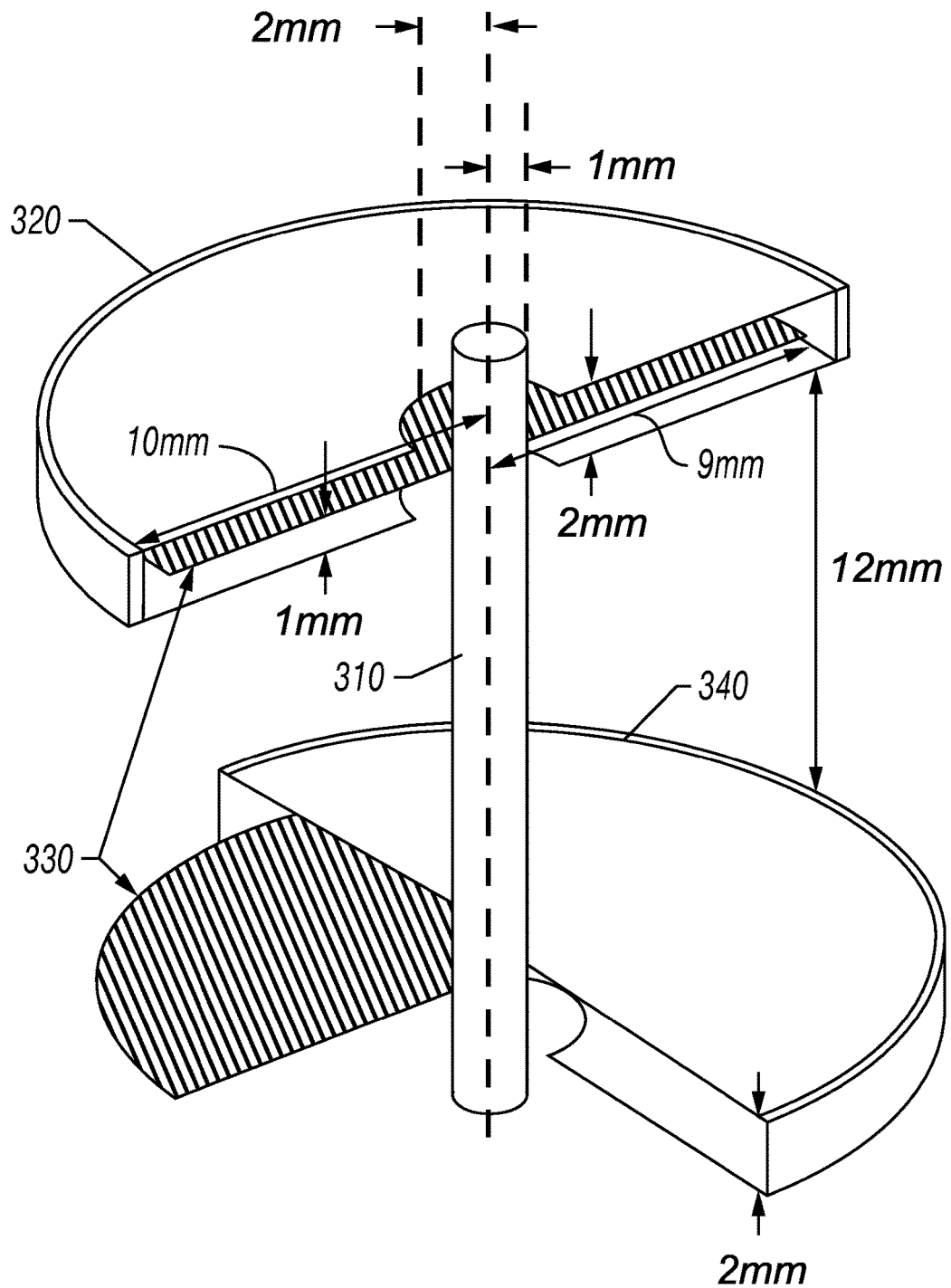
Figure 4C:
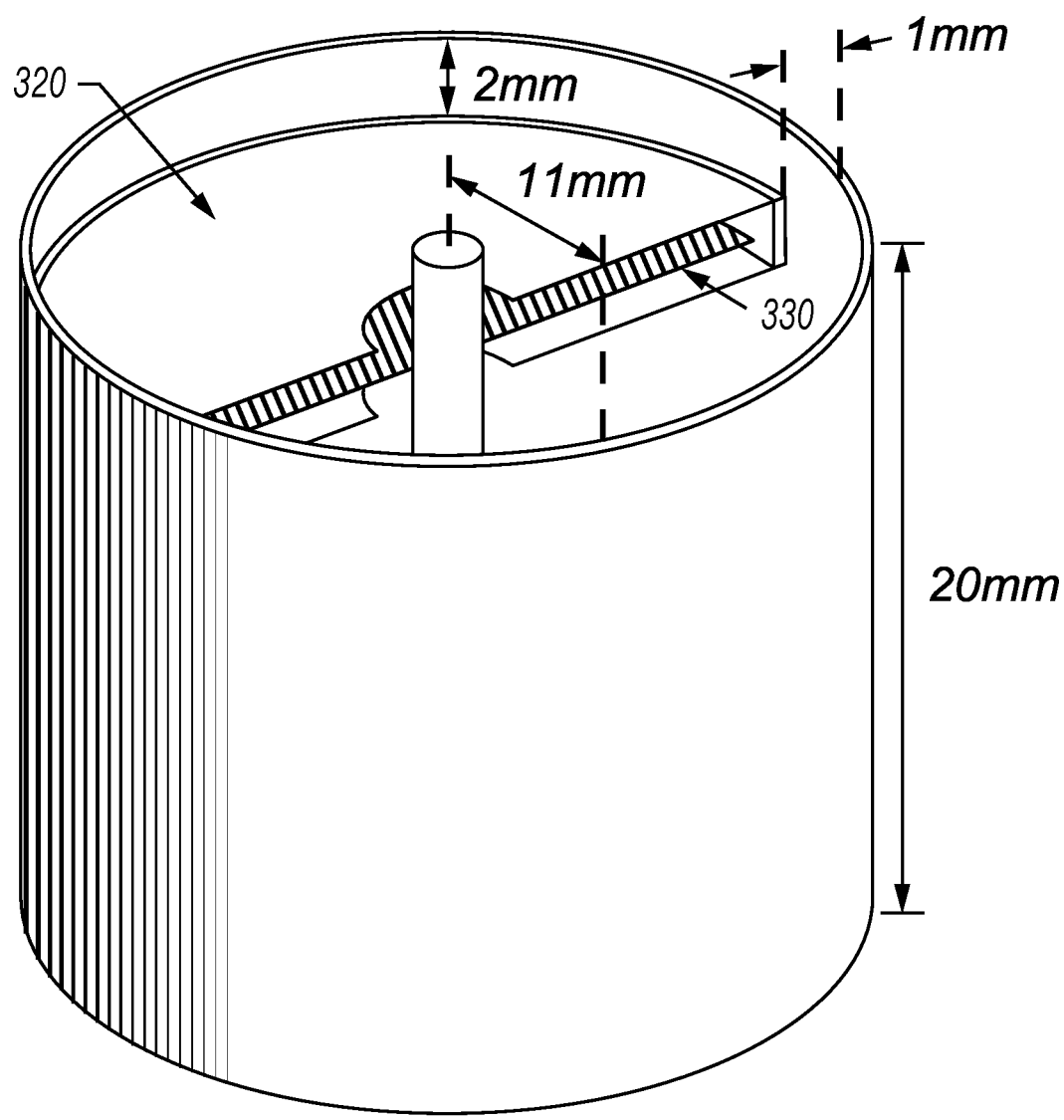
Figure 4D:
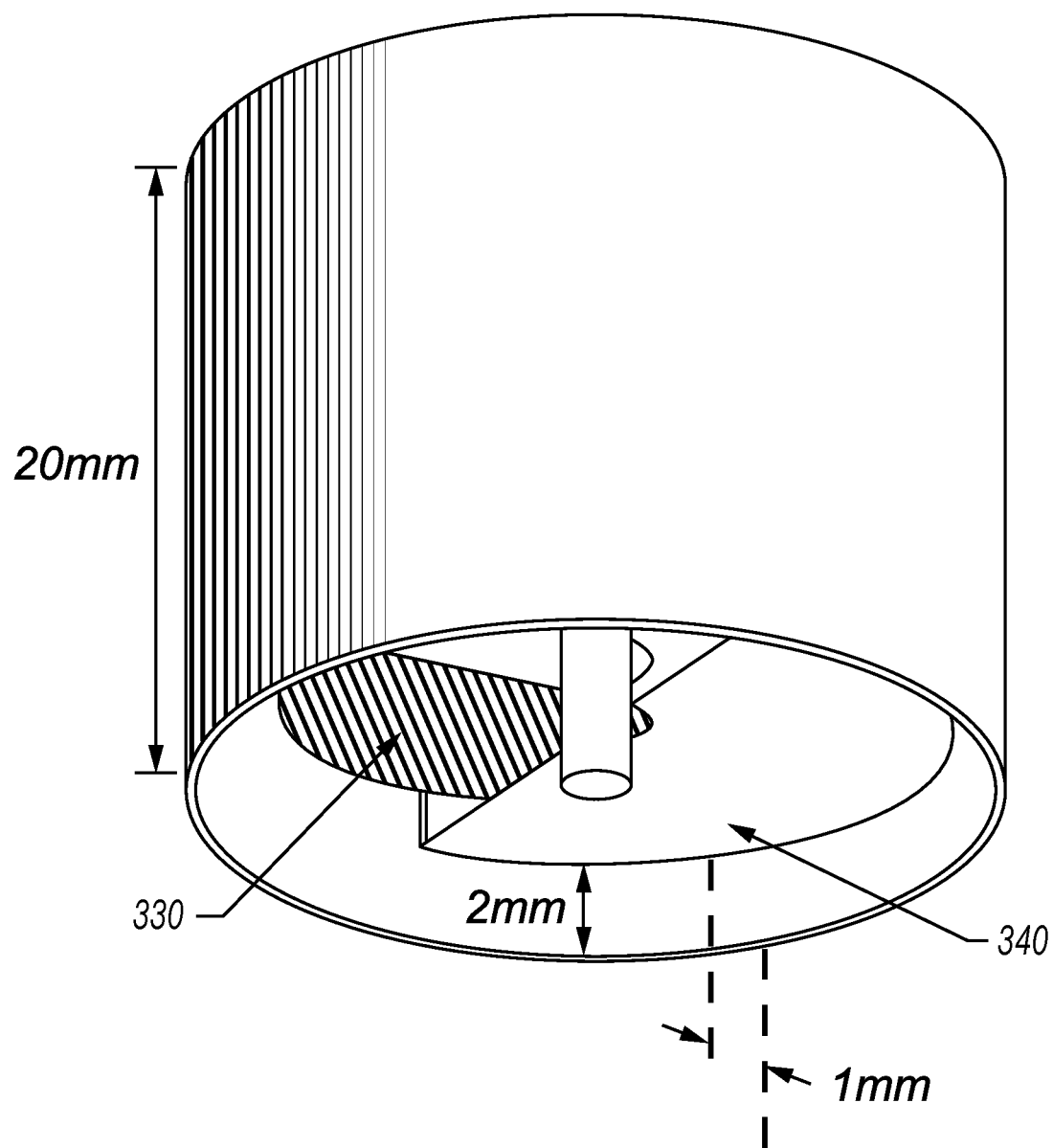

FIG. 3 illustrates two views of another embodiment 300 and FIGS. 4a-4d illustrate additional views with sample dimensions. For comparison purposes, some dimensions of the sensor are also shown in FIGS. 3 and 4, but it is understood that a sensor may have larger or smaller dimensions depending on a particular need. In this example, the rotating plates 330 are "enclosed" by fixed plates 320 and 340 respectively. The rotating plates 330 in this example are 0.1 mm thick and about 9 mm in radius. It is connected to the axle 310 which is held in place with a pair of bearings and can rotate freely. The axle 310 is about 1.0 mm in radius. It is also electrically connected to common lead 332. There are rotating plates 330; one is enclosed within fixed 0-plates 320 and another within fixed 90-plates 340. All 0-plates 320 are electrically connected to lead 322 and all 90-plates 340 are electrically connected to lead 342. All three leads 322, 332 and 342 are preferably made of rigid conductors such that the stray capacitances due to the leads are stable. This helps to improve the accuracy and consistency of the capacitance measurements of the 0- and 90-capacitors. The 0-capacitor Cy can be measured via lead 322 and lead 332; similarly, 90-capacitor Cx can be measured via lead 342 and lead 332. The fixed plates 320 and 340 are 10.0 mm in radius with a center hole of 2.0 mm in radius to accommodate the axle 310, as shown in FIG. 4b. The sensor 300 may be housed in a metal housing 400 as shown in FIG. 4a, 4c or 4d. The fixed plates 320 or 340 have a gap that is about 2 mm from the top or the bottom of the housing as shown in FIGS. 4c and 4d. There is 1.0 mm gap on the side between the fixed plates 320, 340 and the housing wall. The housing is about 11.0 mm in radius and 20.0 mm in height. At this physical size, the sensor may be used in many industries.

In this example, each fixed 0-plate 320 or 90-plate 340 has a pair of plates on top and bottom of the fixed plate. The pair of fixed plates forms a shell that may provide more mechanical and structural protection for the enclosed rotating plate 330. They may also provide better electromagnetic isolation of the rotating plate 330 and reduce stray capacitance of the capacitor.

Figure 5A:
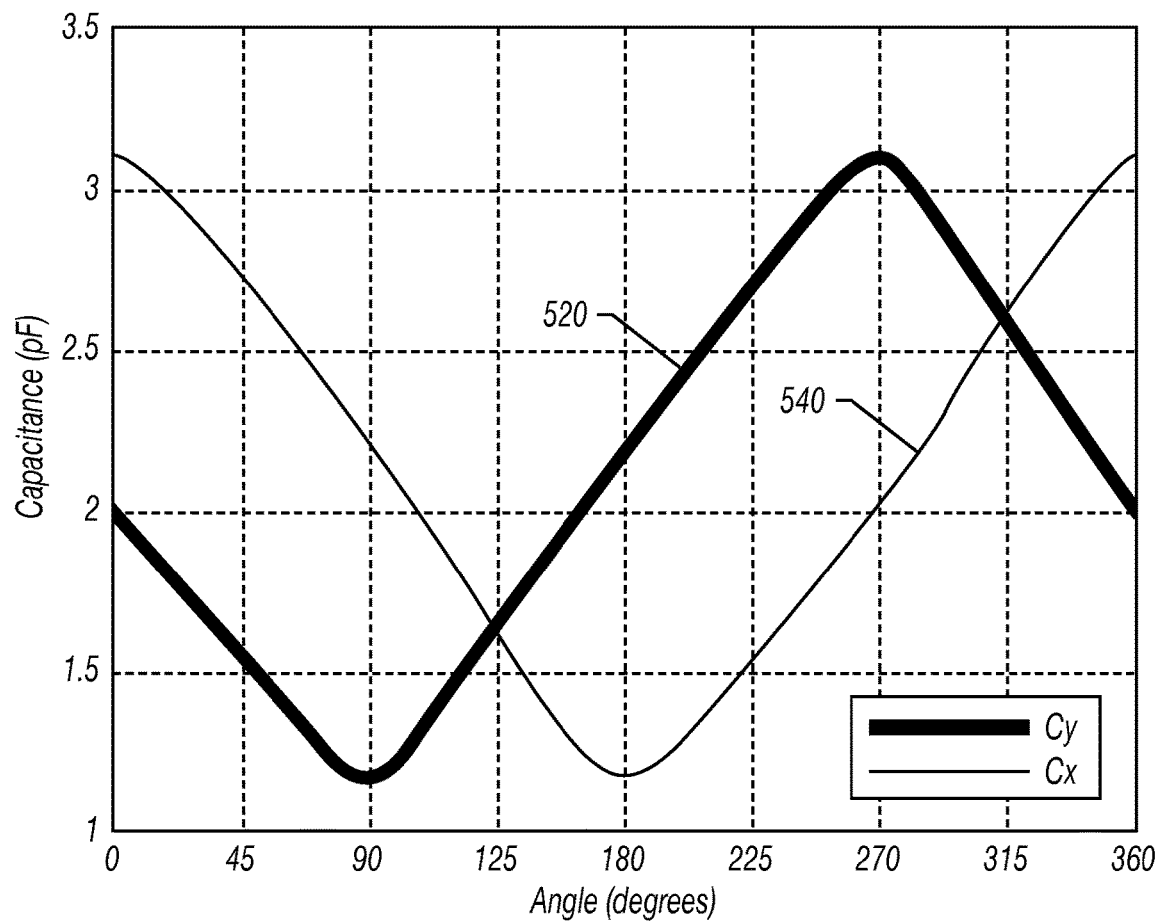
FIG. 5a illustrates a diagram of angle versus capacitance of the capacitors in the sensor as shown in FIG. 3.
Figure 5B:
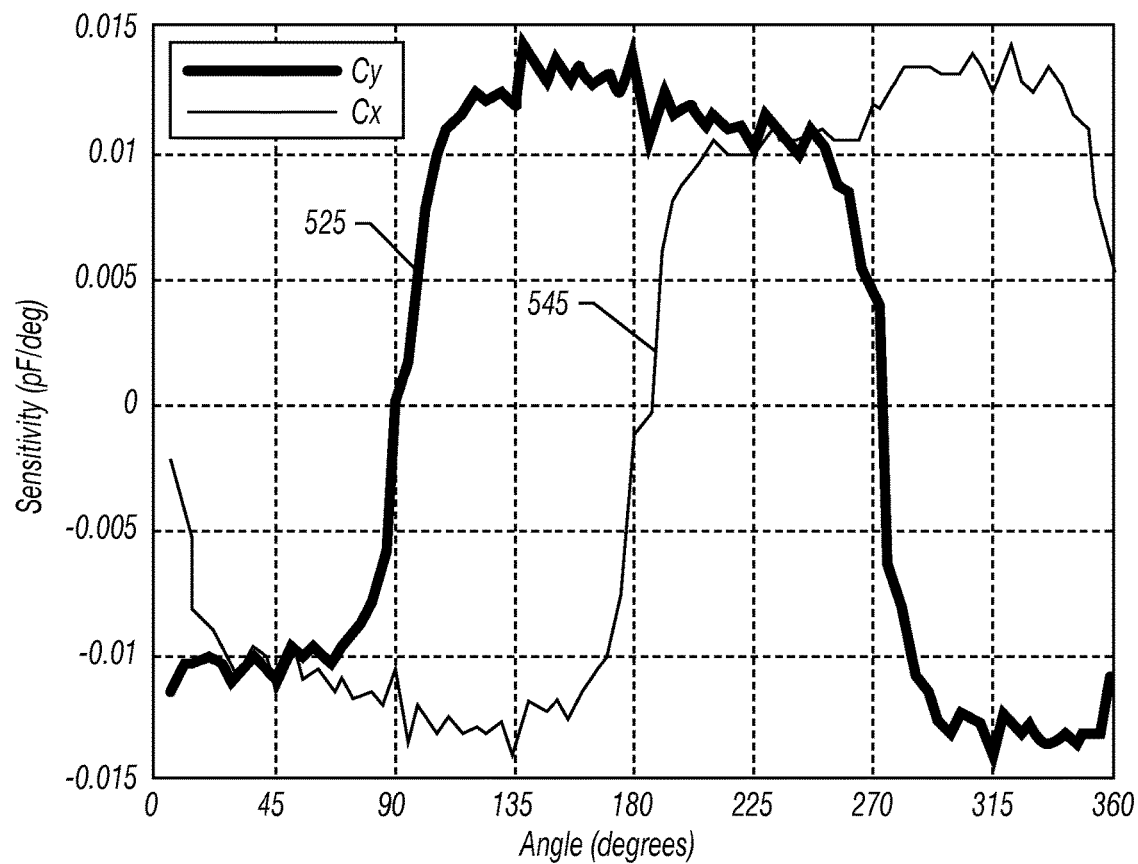
FIG. 5b illustrates a diagram of angle versus sensitivity of the capacitors in the sensor as shown in FIG. 3.

FIGS. 5a and 5b illustrate two properties of the sensor as shown in FIGS. 3 and 4. The curve 520 is the angle versus capacitance for capacitor Cy; curve 540 is that for capacitor Cx. As described above, from these two curves and the measurement of Cy and Cx, the location of the rotating plate 330 or axle 310 can be uniquely determined. It is noted that the capacitances shown in FIG. 5a do not go to zero, as those shown in FIG. 2, when the rotating plate is completed outside or at the opposite side of the fixed plate. This is due to the parasitic capacitance from the edges of plates. In this example, the minimum (or parasitic) capacitance is about 1.4 pF, while the maximum capacitance is about 3.05 pF for Cx and 3.1 pF for Cy. These parameters may be useful when selecting acquisition circuits or electronics for the sensor.

Curves 620 and 640 illustrate the sensitivities of the two capacitors Cy and Cx. The sensitivity is about 20 fF per degree (FIG. 6 uses pF unit. 1 pF=1000 fF), although the sensitivity near 0-degree or 180 degree is much less. One of the reasons for the reduced sensitivity is the parasitic capacitance.

The sensitivity and linearity is good when the capacitance is not near the maximum or the minimum; they are not good when the capacitance is near the maximum or the minimum. The sensitivity is very low or inconsistent when the capacitance is near the minimum. Looking at curve 525 for example, the sensitivity for capacitor Cy, the sensitivity is about −0.01 pF/deg in the range of 0-60, 300-360 degrees; +0.01 pF/deg in the range of 120-240 degrees; the sensitivity is less than 0.01 pF/deg and may not be consistent in the ranges of 60-120 and 240-300 degrees. The sensitivity is inconsistent and may vary widely in the range of 70-100 degrees when the capacitance is at its minimum and not reliable due to the parasitic capacitance. Still referring to FIG. 5b, looking at curve 545, at the sensitivity for capacitor Cx, the sensitivity is about −0.01 pF/deg in the range of 30-150 degrees; +0.01 pF/deg in the range of 210-330 degrees; the sensitivity is less than 0.01 pF/deg and may not be consistent in the ranges of 0-30, 150-210 and 330-360 degrees. The sensitivity is inconsistent and may vary widely in the range of 170-200 degrees when the capacitance is at its minimum and is not reliable due to the parasitic capacitance.

When the two capacitors Cy and Cx are considered together, in a non-linear range of angles (e.g. 70-100 degrees for Cy), ignoring the exact reading from the non-linear capacitor (e.g. Cy), only that it is near its minimum or maximum, and accepting the linear reading from the linear capacitor (e.g. Cx), the angle versus capacitances are still linear. Therefore, the sensor can cover the entire 360 degree range with a linear response and constant sensitivity. As long as the nonlinear ranges of the two capacitors do not overlap with each other, then the overall linearity of the sensor may be maintained. In the above example, as long as the two fixed plates are offset by at least about 30 degrees, nonlinear ranges will not overlap.

In examples as shown in FIGS. 3 and 4, the fixed plates are offset by 90 degrees. The sensor can still operate with the same overall linearity if the fixed plates are offset by a different amount as long as the nonlinear ranges do not overlap.

Figure 6A:
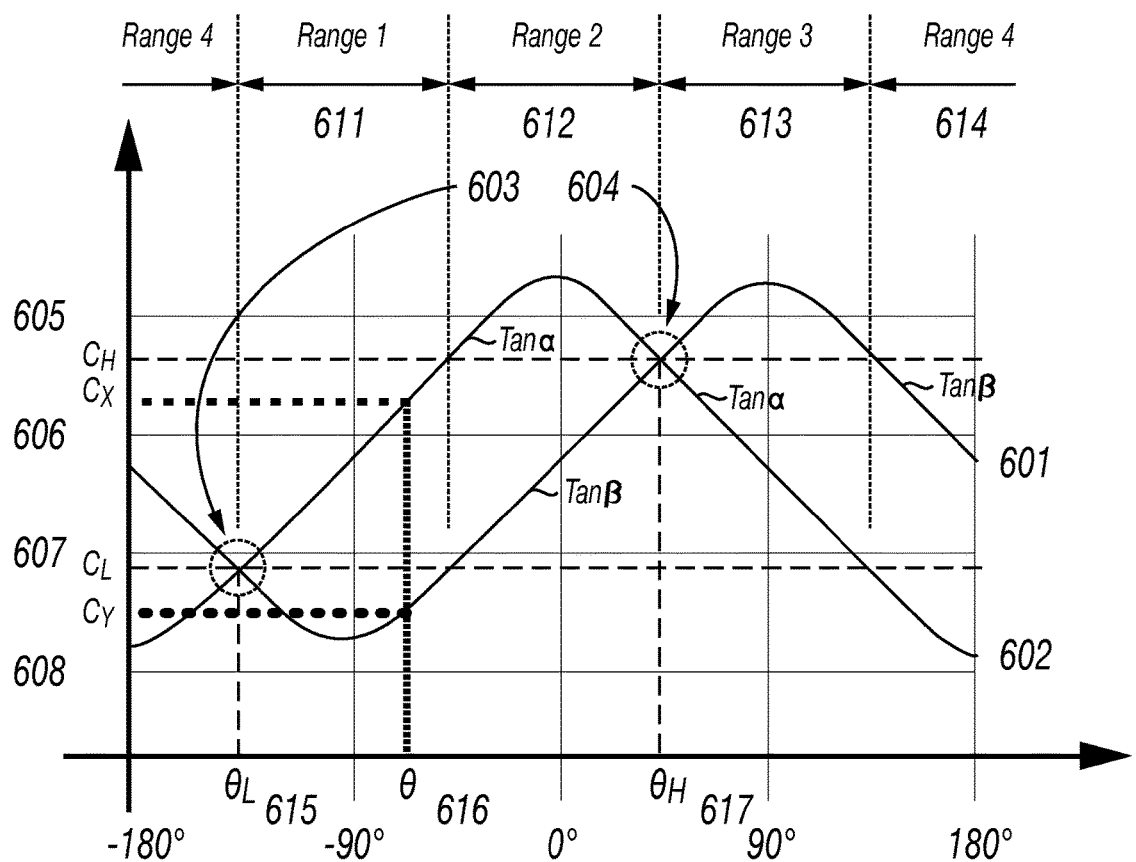
FIG. 6a illustrates a diagram of capacitance to angle conversion and FIG. 6b illustrates a process flow diagram of the conversion.
Figure 6B:
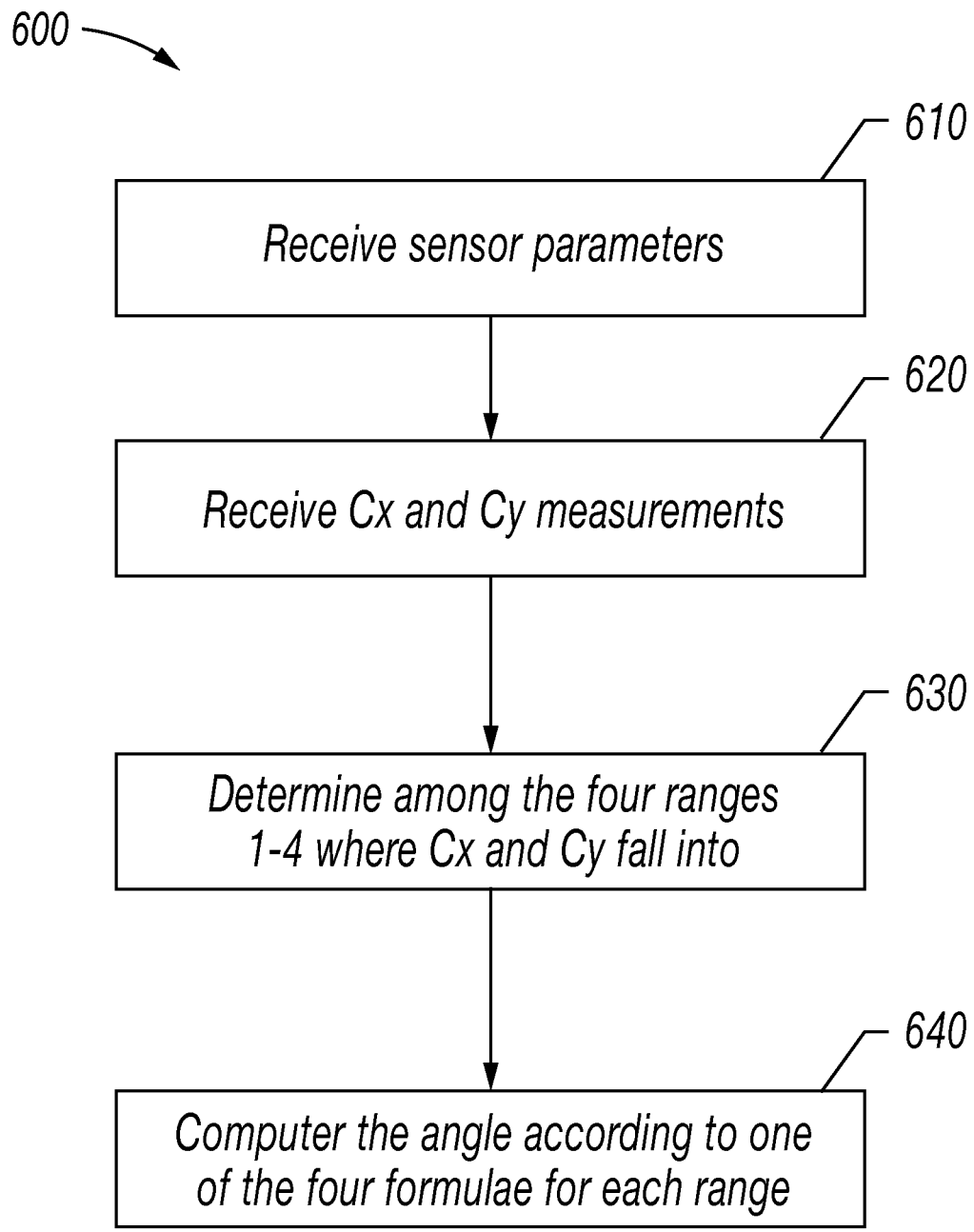

FIGS. 6a and 6b illustrate an example method to convert measured capacitance Cx and Cy to an actual angle. FIG. 6a illustrates more details of the capacitance to angle relationship. The angle vs Cy is curve 601 and the angle vs Cx is curve 602. The two curves 601 and 602 have two intersections 603 and 604. At low capacitance intersection 603, the capacitance Cl 607 and angle θ_l; at high capacitance intersection 604, the capacitance Ch 605 and angle θ_h. The sensitivities of the curves 601 or 602 are tan(α) and tan(β). They are identical if the two fixed plates are identical. These six parameters are related to the structure of the two fixed plates and the rotating plate and are known once the sensor is manufactured. For better performance, the linearity and sensitivity of Cx and Cy in the range between Cl and Ch should be the optimum.

Depending on the Cx and Cy value, the full −180 to +180 angle range may be divided into four ranges: rang 1 (611), rang 2 (612), rang 3 (613) and rang 4 (614). In each angle range (or corresponding capacitance range), the angle may be uniquely determined based on the measured capacitances as further described below.

When the sensor is made, the above six parameters (Ch, Cl, θ_l, θ_h, tan(α) and tan(β)) are fixed. They may either be given by the sensor manufacturer, or they can be determined during sensor calibration. There are many methods that can be used to convert the capacitance measurement of Cx and Cy to an angle θ.

FIG. 6b illustrates one example method 600 that converts capacitance to angle. Method 600 may have the following steps:

610, receive sensor parameters, Ch, Cl, θ_l, θ_h, tan(α) and tan(β);

620, receive Cx and Cy, the capacitance measurements;

630, determine among the four ranges 1-4 where Cx and Cy fall:

If $Cl<C_x<C_h$ and $C_y<Cl$, they are in range 1,
If $C_l<Cy<Ch$ and $Cx>Ch$, they are in range 2,
If $Cl<Cx<Ch$ and $Cy>Ch$, they are in range 3,
If $C_l<C_y<Ch$ and $Cx<Cl$, they are in range 4,

640, compute the angle according to one of the four formula for each range 1-4:

For range 1, $\theta=\theta\_l+(Cx-Cl)/\tan(\alpha)$

For range 2, $\theta=\theta\_h-(Ch-Cy)/\tan(\beta)$

For range 3, $\theta=\theta\_h+(Ch-Cx)/\tan(\alpha)$

For range 4, $\theta=\theta\_l-(Cy-Cl)/\tan(\beta)$ if range 4 answer is less than −180° then add 360° to θ. Method 600 converts capacitance measurements to an angle in the full range of −180 to +180 degrees.

The sensor shown in FIGS. 5a and 5b has a sensitivity of about 0.01 pF/deg. Depending on the resolution of the acquisition circuit, the resolution of the angular position measurement may be determined. The higher the resolution of the acquisition circuit, the higher the angular resolution.

There are many acquisition circuits that may be used with the sensor described above, either a custom made circuit or a general purpose IC chip. For illustrative purposes, one type of IC chips called Capacitance to Digital Converters (CDCs) may be used. These are generally used in touch sensor panels, such as touch screens in smart cell phones. In particular, an IC chip AD-7150 has the following specifications:

| Resolution (bits) | 12 |
|---|---|
| Through put rate | 200 Hz |
| Channels | 2 |
| Capacitance range | 4 pF |
| Cancellable offset Capacitance | 13 pF |
| Digital I/F | 12C |
| Package | SOP |

Figure 7:
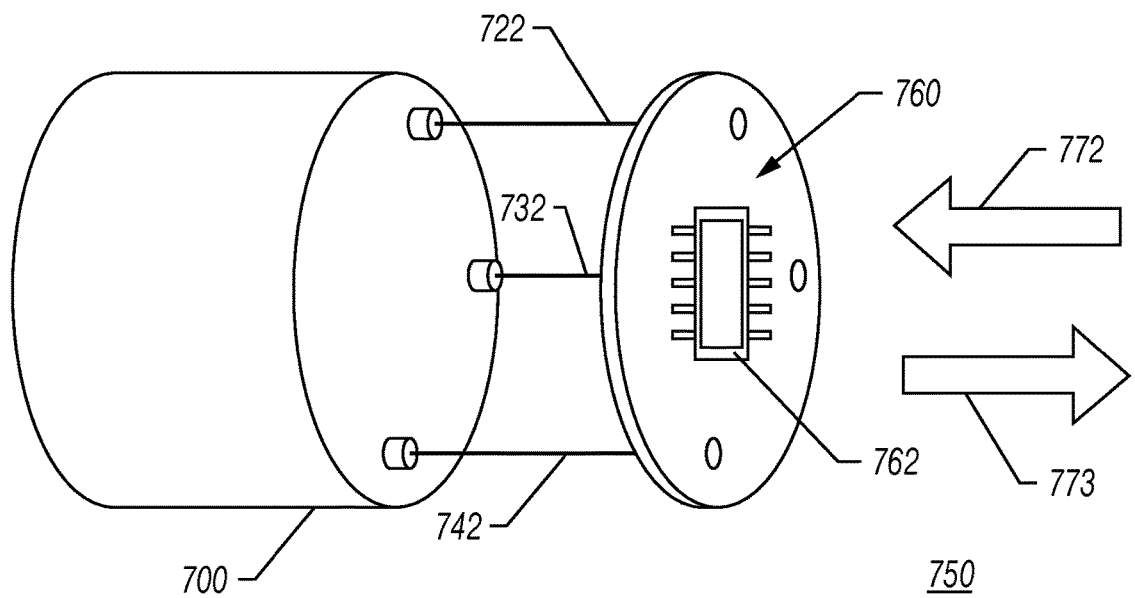
FIG. 7 illustrates packaging of a sensor according to one embodiment.

If this chip is used with a sensor as described above in FIGS. 3 and 4, it may be integrated into a sensor 750 as shown in FIG. 7. The sensor capacitors (not shown) are enclosed in a metal housing 700, which provides both mechanical and electromagnetic isolation of the sensor capacitors. Three leads 722, 732 and 742 from the sensor housing for 0-plate, rotating plate and 90-plate are rigidly and electrically connected to the chip 762 via a PCB 760. There is no flexible wiring between any electrical components among the capacitor plates and the acquisition circuit 762. The electrical connections between the sensor and the acquisition chip are made of rigid metal and the lengths are minimized. The rigidity and short length of the connections can minimize any variable parasitic capacitance or stray capacitance, which may affect the consistency and accuracy of the sensor measurement. The integrated sensor 750 receives input power 772 and transmits digital output 773. The digital output 773 represents the capacitance of the two capacitors Cy and Cx. The processor outside the sensor may convert the two capacitances into degrees as an angular measurement. The capacitance-to-angle conversion may be done locally in real-time or remotely at a later time. This integrated sensor 750 is small and simple. It can be easily put into any instrument or tool that needs an angle sensor.

Figure 8:
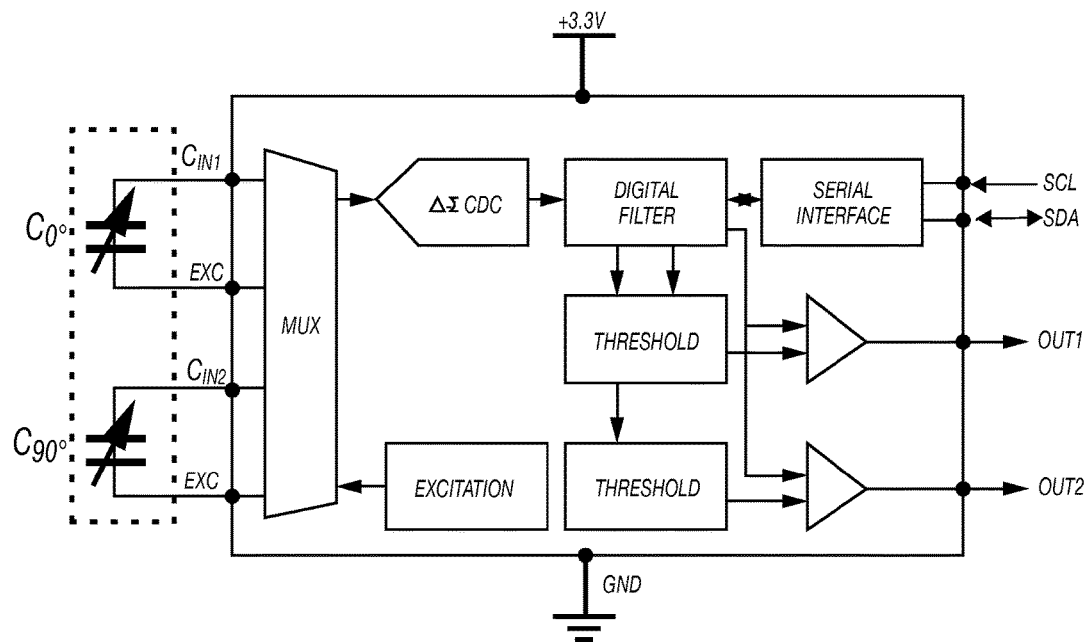
FIG. 8 illustrates a logical block diagram of the acquisition circuit in FIG. 7.

The input/output connections and internal logics of chip AD-7150 are shown in FIG. 8 for illustrative purpose. Other chips may also be used.

For sensor 750 with AD-7150, which can measure two capacitors up to 4 pF with 12 bit resolution, the capacitance resolution would be: $4 \text{ pF}/2^{12} = 1 \text{ fF/bit}$.

The sensitivity of sensor 400 is about 10 fF/deg according to FIG. 5b. Therefore, the angular measurement resolution of sensor 750 is about $(1 \text{ fF/bit})/(10 \text{ fF/deg}) = 0.1 \text{ deg/bit}$.

A sensor similar to sensor 400 may be used in a prior art tool to replace an existing angle sensor as in FIG. 1b. In a prior art angle sensor 42, when the tool 22 is deviated from a vertical position, a rotating arm with mass 43 will cause the rotating arm 43 to rotate to a new position where the mass has the minimum potential. The amount of rotation is the same as the angle of the tilt. The prior art angle sensor 42 uses resistance type angle measurement, where the rotating arm 43 makes contact with a circular resistor. Depending on the position of the contact between the arm 43 and the resistor, the electrical resistance between them is different and is proportional to the angle. There is friction between the arm 43 and the resistor due the necessary contact between them. Only when the tilt is large enough will the gravitational force be able to overcome the static friction and move the rotating arm 43. In one example, the minimum tilt is about 16 degrees.

If the prior art angle sensor 42 is replaced with a sensor 750, where a rotating arm can move the rotating plates 330, there is no or very little friction for the rotating plates, because there is nothing in contact with the rotating plates 330. In one example, the minimum angle of tilt is about 1 degree or less to move the rotating plates.

The sensor 750 is compact, self-contained and integrated. There are no moving parts that are in contact with other components inside or outside the sensor. There is no friction.

As those with skill in the art will understand, one or more of the steps of methods discussed above may be combined and/or the order of some operations may be changed. Further, some operations in methods may be combined with aspects of other example embodiments disclosed herein, and/or the order of some operations may be changed. The process of measurement, its interpretation, and actions taken by operators may be done in an iterative fashion; this concept is applicable to the methods discussed herein. Finally, portions of methods may be performed by any suitable techniques, including on an automated or semi-automated basis on computing system 900 in FIG. 9.

Figure 9:
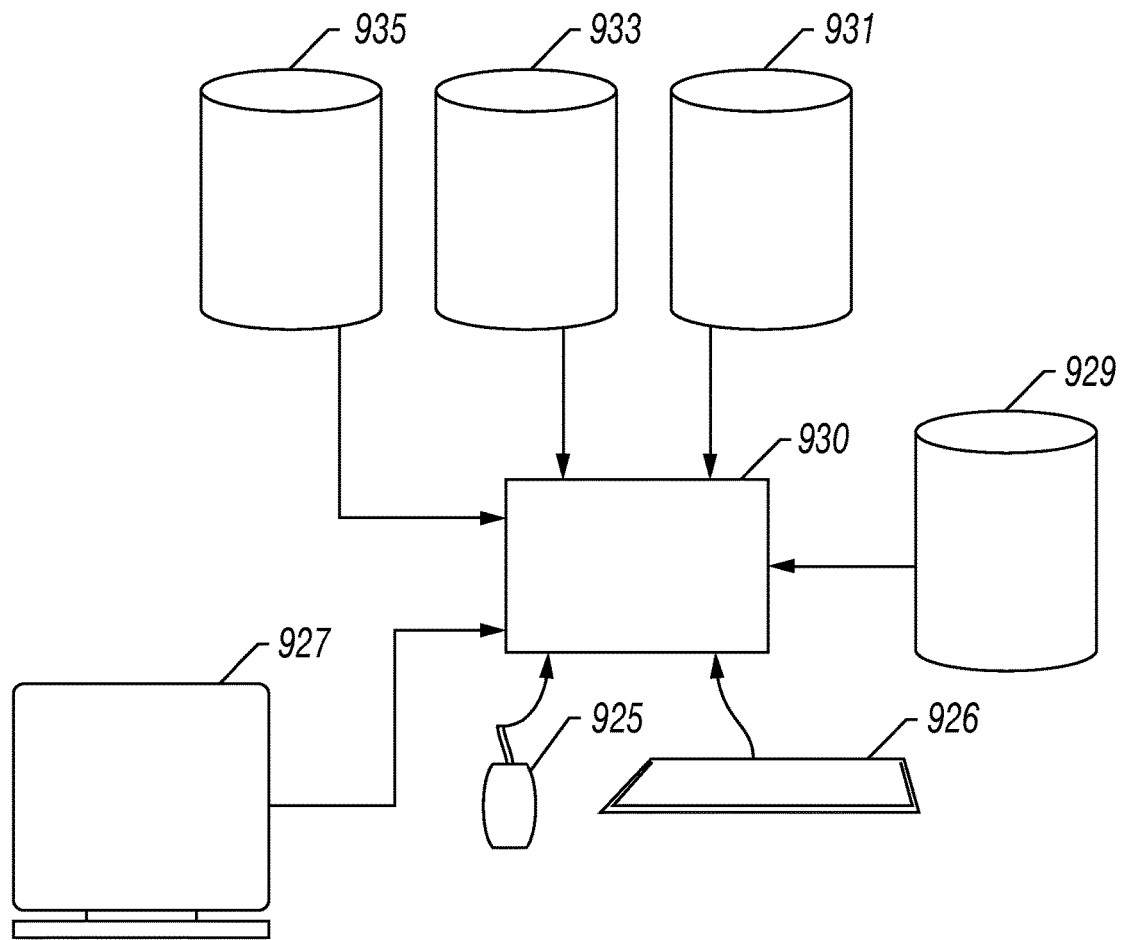
FIG. 9 illustrates a schematic view of a computer system where some of the methods disclosed can be implemented.

Portions of methods described above may be implemented in a computer system 900, one of which is shown in FIG. 9. The system computer 930 may be in communication with disk storage devices 929, 931, 933 and 935, which may be external hard disk storage devices and measurement sensors (not shown). It is contemplated that disk storage devices 929, 931, 933 and 935 are conventional hard disk drives, and as such, may be implemented by way of a local area network or by remote access. While disk storage devices are illustrated as separate devices, a single disk storage device may be used to store any and all of the program instructions, measurement data, and results as desired.

In one implementation, real-time data from the sensors may be stored in disk storage device 931. Various non-real-time data from different sources may be stored in disk storage device 933. The system computer 930 may retrieve the appropriate data from the disk storage devices 931 or 933 to process data according to program instructions that correspond to implementations of various techniques described herein. The program instructions may be written in a computer programming language, such as C++, Java or the like. The program instructions may be stored in a computer-readable medium, such as program disk storage device 935. Such computer-readable media may include computer storage media. Computer storage media may include volatile and non-volatile media, and removable and non-removable media implemented in any method or technology for storage of information, such as computer-readable instructions, data structures, program modules or other data. Computer storage media may further include RAM, ROM, erasable programmable read-only memory (EPROM), electrically erasable programmable read-only memory (EEPROM), flash memory or other solid state memory technology, CD-ROM, digital versatile disks (DVD), or other optical storage, magnetic cassettes, magnetic tape, magnetic disk storage or other magnetic storage devices, or any other medium which can be used to store the desired information and which can be accessed by the system computer 930. Combinations of any of the above may also be included within the scope of computer readable media.

In one implementation, the system computer 930 may present output primarily onto graphics display 927, or via printer 928 (not shown). The system computer 930 may store the results of the methods described above on disk storage 929, for later use and further analysis. The keyboard 926 and the pointing device (e.g., a mouse, trackball, or the like) 925 may be provided with the system computer 930 to enable interactive operation.

The system computer 930 may be located on-site, e.g. as part of processing unit 23 on-board a vessel 20 as in FIG. 1 or at a data center remote from the field. The system computer 930 may be in communication with equipment on site to receive data of various measurements. Such data, after conventional formatting and other initial processing, may be stored by the system computer 930 as digital data in the disk storage 931 or 933 for subsequent retrieval and processing in the manner described above. While FIG. 9 illustrates the disk storage, e.g. 931 as directly connected to the system computer 930, it is also contemplated that the disk storage device may be accessible through a local area network or by remote access. Furthermore, while disk storage devices 929, 931 are illustrated as separate devices for storing input data and analysis results, the disk storage devices 929, 931 may be implemented within a single disk drive (either together with or separately from program disk storage device 933), or in any other conventional manner as will be fully understood by one of ordinary skill in the art having reference to this specification.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. §112, paragraph 6 for any limitations of any of the claims herein, except for those in which the claim expressly uses the words 'means for' together with an associated function.

What is claimed is:

1. A capacitor based angle sensor having an x-y-z coordinate system, the sensor comprising:
   a semicircular electrically conducting rotating plate having an axle along the z-axis at the center of the semicircle, wherein the rotating plate can rotate freely in x-y plane around the z-axis;
   a first fixed electrically conducting plate having one first straight edge along the x-axis where the first plate is in the x-y plane and the z-axis passes through the first center of first straight edge;
   a second fixed electrically conducting plate having one second straight edge where the second plate is in the x-y plane and the z-axis passes through the second center of second straight edge; wherein an offset angle between the first straight edge and the second straight edge is neither 0 nor 180 degrees;
   a common lead electrically connected to the rotating plate;
   a first lead electrically connected to the first fixed plate; and
   a second lead electrically connected to the second fixed plate;
      wherein the first fixed plate and the rotating plate form a first capacitor having a first capacitance Cx, which can be detected via the common lead and the first lead;
      wherein the second fixed plate and the rotating plate form a second capacitor having a second capacitance Cy, which can be detected via the common lead and the second lead;
   an acquisition circuit, electrically connected to the common lead, the first lead and the second lead, the acquisition circuit comprising;
      an electric power input;
      a digital data input/output; and
      an IC chip; and
      wherein the acquisition circuit is configured to obtain digitized capacitance data from the digital data output representing the first capacitance Cx and the second capacitance Cy;
   a microprocessor electrically connected to the acquisition circuit;
      wherein the microprocessor is configured to determine an angular position based on the digitized first capacitance Cx and the digitized second capacitance Cy by:
         determining sensor parameters of the capacitor based angle sensor by obtaining low capacitance Cl, and low angle $\theta\_l$ at the low capacitance intersection of a plot of an angle $\theta$ vs Cx and an angle $\theta$ vs Cy, and high capacitance Ch, and high angle $\theta\_h$, at the high capacitance intersection of the plot, and sensitivity of Cy $\tan(\alpha)$ and sensitivity of Cx $\tan(\beta)$;
         receiving the first and the second capacitances Cx and Cy;
         determining among the four ranges 1-4 where the first and second capacitance Cx and Cy fall:
         if Cl<Cx<Ch and Cy<Cl, they are in range 1,
         if Cl<Cy<Ch and Cx>Ch, they are in range 2,
         if Cl<Cx<Ch and Cy>Ch, they are in range 3,
         if Cl<Cy<Ch and Cx<Cl, they are in range 4; and
         computing the angle $\theta$ according to one of the four formula for each range 1-4:

for range 1, $\theta = \theta\_l + (Cx-Cl)/\tan(\alpha)$, for range 2, $\theta = \theta\_h - (Ch-Cy)/\tan(\beta)$, for range 3, $\theta = \theta\_h + (Ch-Cx)/\tan(\alpha)$, for range 4, $\theta = \theta\_l - (Cy-Cl)/\tan(\beta)$;

if range 4 answer is less than −180 degree, add 360 degree to $\theta$.

2. The sensor of claim 1, wherein the first plate and the second plate are substantially same, both of which are of rectangular shape having a long side and a short side, wherein the first edge and the second edge are along the long side.

3. The sensor of claim 1, wherein the first plate and the second plate are substantially same, both of which are of semicircular in shape.

4. The sensor of claim 1, wherein the first plate, the second plate and the rotating plate are metal plates.

5. The sensor of claim 1, wherein the first plate, the second plate and rotating plate are made of non-conductive substrate with conductive coating.

6. The sensor of claim 1, wherein the offset angle is about 90 degrees.

7. The sensor of claim 1, further comprising:
a third fixed electrically conducting plate, wherein the third plate is substantially same as the second plate, and wherein the second plate and the third plate form a third capacitor having a third capacitance as a reference capacitor for an environment effect compensation for the first and second capacitors.

8. The sensor of claim 1, further comprising:
a housing enclosing the first and second plates, the rotating plate and its axle, wherein the housing is sealed and is under vacuum or filled with inert gas within the housing.

9. The sensor of claim 8, wherein the housing is embedded in a tool operable in a downhole environment.

10. A capacitor based angle sensor having an x-y-z coordinate system, the sensor comprising:
a first capacitor and a second capacitor;
the first capacitor comprising:
  a first rotating plate, wherein the first rotating plate is semicircular and electrically conducting, has an axle along the z-axis at the center of the semicircle, rotates freely in x-y plane around the z-axis and is aligned at 0 degree; and
  a first pair of fixed plates, wherein the first pair of fixed plates is electrically conducting and semicircular, has centers of the semicircles along the z-axis, is aligned at 0 degrees and cover the first rotating semicircular plate;
the second capacitor comprising:
  a second rotating plate, wherein the second rotating plate is semicircular and electrically conducting, has a shared axle along the z-axis at the center of the semicircle, rotates freely in x-y plane around the z-axis and is aligned at an offset degree; and
  a second pair of fixed plates, wherein the second pair of fixed plates is electrically conducting and semicircular, has centers of the semicircles along the z-axis, is aligned at the offset angle and covers the second rotating semicircular plate when the second rotating semicircular plate rotates;
a common lead electrically connected to the first rotating plate and the second rotating plate;
a first lead electrically connected to a first fixed plates; and
a second lead electrically connected to a second fixed plates;
wherein the first fixed plates and the first rotating plate form a first capacitor having a first capacitance Cx, which can be detected via the common lead and the first lead;
wherein the second fixed plates and the second rotating plate form a second capacitor having a second capacitance Cy, which can be detected via the common lead and the second lead;
an acquisition circuit comprising;
  an electric power input;
  a digital data input/output; and
  an IC chip;
wherein the acquisition circuit is rigidly attached to a side of a housing, and electrically connected to the common lead, the first lead and the second lead; and
wherein the acquisition circuit is configured to digitize capacitance data from the digital data output representing the first capacitance Cx and the second capacitance Cy;
a microprocessor electrically connected to the acquisition circuit;
wherein the microprocessor is configured to determine an angle $\theta$ based on the digitized first capacitance and the digitized second capacitance by:
  determining parameters of the capacitor based angle sensor by obtaining low capacitance Cl, and low angle $\theta\_l$ at the low capacitance intersection of a plot of an angle $\theta$ vs Cx and an angle $\theta$ vs Cy, and high capacitance Ch, and high angle $\theta\_h$, at the high capacitance intersection of the plot, and sensitivity of Cy $\tan(\alpha)$ and sensitivity of Cx $\tan(\beta)$;
  measuring first and second capacitances Cx and Cy;
  determining among the four ranges 1-4 where the first and second capacitance fall:
    if Cl<Cx<Ch and Cy<Cl, they are in range 1,
    if Cl<Cy<Ch and Cx>Ch, they are in range 2,
    if Cl<Cx<Ch and Cy>Ch, they are in range 3,
    if Cl<Cy<Ch and Cx<Cl, they are in range 4; and
  computing the angle $\theta$ according to one of the four formula for each range 1-4:

for range 1, $\theta = \theta\_l + (Cx - Cl)/\tan(\alpha)$, for range 2, $\theta = \theta\_h - (Ch - Cy)/\tan(\beta)$, for range 3, $\theta = \theta\_h + (Ch - Cx)/\tan(\alpha)$, for range 4, $\theta = \theta\_l - (Cy - Cl)/\tan(\beta)$;

if range 4 answer is less than −180 degree, add 360 degree to $\theta$;
  outputting the angle $\theta$ of the capacitor based angle sensor to interpret logging data obtained by the downhole tool.

11. The sensor of claim 10, wherein the first pair of fixed plates, the second pair of fixed plates, the first rotating plate and the second rotating plate are metal plates.

12. The sensor of claim 10, wherein the offset angle is about 90 degrees.

13. The sensor of claim 10, further comprising:
the housing enclosing the first pair of fixed plates, the second pair of fixed plates, the first rotating plate, the second rotating plate and the axle.

14. The sensor of claim 13, wherein the housing is sealed and is under vacuum or the housing is filled with inert gas.

15. A method for measuring an angle $\theta$ of a downhole tool, comprising:
deploying the downhole tool comprising an angle sensor with at least two capacitors having capacitances Cx and Cy;
determining sensor parameters of the angle sensor by obtaining low capacitance Cl, and low angle $\theta\_l$ at the low capacitance intersection of a plot of an angle $\theta$ vs Cx and an angle $\theta$ vs Cy, and high capacitance Ch, and high angle $\theta\_h$, at the high capacitance intersection of the plot, and sensitivity of Cy $\tan(\alpha)$ and sensitivity of Cx $\tan(\beta)$;
measuring first and second capacitances Cx and Cy;
determining among the four ranges 1-4 where the first and second capacitance fall:
  if Cl<Cx<Ch and Cy<Cl, they are in range 1,
  if Cl<Cy<Ch and Cx>Ch, they are in range 2,
  if Cl<Cx<Ch and Cy>Ch, they are in range 3,
  if Cl<Cy<Ch and Cx<Cl, they are in range 4; and
computing the angle $\theta$ according to one of the four formula for each range 1-4:

for range 1, $\theta = \theta\_l + (Cx - Cl)/\tan(\alpha)$, for range 2, $\theta=\theta\_h-(Ch-Cy)/\tan(\beta)$, for range 3, $\theta=\theta\_h+(Ch-Cx)/\tan(\alpha)$, for range 4, $\theta=\theta\_l-(Cy--Cl)/\tan(\beta)$;

if range 4 answer is less than −180 degree, add 360 degree to θ;

outputting the angle θ of the downhole tool to interpret logging data obtained by the downhole tool.

* * * * *